(12) United States Patent
Mahooti et al.

(10) Patent No.: US 7,986,255 B2
(45) Date of Patent: Jul. 26, 2011

(54) HIGH RESOLUTION OVERLAPPING BIT SEGMENTED DAC

(75) Inventors: Kevin Mahooti, Sunnyvale, CA (US); He Bo, Shanghai (CN); Meng Hao, Shanghai (CN); Johnny Chuang-Li Lee, Santa Clara, CA (US); Rui Yang, Shanghai (CN); Tian Jie Feng, Shanghai (CN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/625,351

(22) Filed: Nov. 24, 2009

(65) Prior Publication Data

US 2011/0122008 A1    May 26, 2011

(51) Int. Cl.
*H03M 1/66* (2006.01)

(52) U.S. Cl. ......................... 341/145; 318/594

(58) Field of Classification Search .......... 341/115–149; 318/594, 595
See application file for complete search history.

(56) References Cited

U.S. PATENT DOCUMENTS

| | | | | |
|---|---|---|---|---|
| 5,309,344 A | * | 5/1994 | Smith | 363/20 |
| 5,703,587 A | * | 12/1997 | Clark et al. | 341/144 |
| 5,977,899 A | | 11/1999 | Adams | |
| 6,281,652 B1 | * | 8/2001 | Ryan et al. | 318/594 |
| 7,015,738 B1 | | 3/2006 | Cao | |

FOREIGN PATENT DOCUMENTS

GB    2 442 278 A    4/2008

OTHER PUBLICATIONS

Extended European Search Report for Patent Appln. 10192277.1 (Mar. 16, 2011).

* cited by examiner

*Primary Examiner* — Lam T Mai

(57) ABSTRACT

A controller receives an M-bit input and generates, in response, an S-bit upper range binary data feeding S-bit high range DAC and an R-bit lower range data feeding an R-bit low range DAC. The controller detects transition points in the M-bit input and in response, adds a transition data to the S-bit data equal to at least one least significant bit of the S-bit data and subtracts a value from the R-bit data equal to the transition data. The transition points and the transition data are detected and added at points avoiding such transitions at a full scale value of the R-bit data.

7 Claims, 10 Drawing Sheets

HIGH RESOLUTION OVERLAPPING BIT SEGMENTED DAC

TECHNICAL FIELD

The technical field relates generally to digital-to-analog converters (DACs), particularly to segmented DACs within a feedback loop.

BACKGROUND

DACs have a wide range of uses, some of which impose particular performance requirements. For example, DACs are often used in feedback systems having one or more loops with series arrangements of analog and digital devices, requiring respective DACs and analog-to-digital converters (ADC)s. For purposes of this description "analog" means continuous-time and continuous-valued, and "digital" means discrete-time and discrete-valued.

One typical example of such a system samples an analog system state (e.g., the system output) with an N-bit analog-to-digital converter (ADC), compares the digital state sample with a digital reference data, and generates a digital error data. A digital control processor may transform the digital error data through a feedback function to generate an M-bit system control data, where N may be equal to M. An M-bit DAC converts the digital control input data into an analog control signal and inputs this to the system.

The digital control processor generates the M-bit system control data with a value urging the system state in a direction opposite the direction of the error, so as to reduce the error. If the feedback loop is properly designed, and the devices forming the loop are functioning properly, the iterations of error detection, control data calculation, and inputting the control data to the system to urge the system state in a direction reducing the magnitude of the error will cause the system to eventually reach the reference state, regardless of the location of the reference state within the allowable domain of reference states, and regardless of the system's initial state. However, if the loop is not properly designed, or if certain components in the loop have certain kinds of non-ideal operation, the system may, for example, enter a periodic oscillation of over-correcting to be above and then below the reference point.

Selection of a DAC for use in a feedback loop is undertaken in view of the system criteria listed above. DAC parameters bearing on such selection include bit resolution, conversion speed, settling time (which is related to conversion speed), and monotonicity.

The DAC bit resolution establishes, in part, an upper bound on the accuracy to which the system can match the reference signal. The monotonicity establishes, or affects, the system's ability converge, or "lock" to the reference signal, as well as affecting transient behavior of the system in moving from an initial state to, or toward, the reference state. Other selection factors include, for example, cost, power budget, and area and volume budget.

There are three known general DAC architectures for selecting among, and each has known benefits or advantages, as well as drawbacks or limitations, pertaining to its use as a feedback DAC.

One such DAC architecture is the binary weighted M-bit DAC. A binary M-bit DAC consists generally of one voltage-to-current source for each of the M input bits, each of the sources exponentially weighted according to the bit position. A four-bit binary weighted DAC, for example, consists of four weighted current sources; an LSB source that converts a "1" to $2^0$, i.e., one LSB unit of current; a next higher bit source that converts a "1" to $2^1$ or two LSB units of current, continuing to an MSB bit source, that converts a "1" to $2^3$ or eight LSB units of current.

The advantage of the binary weighted DAC is a low parts count, because it needs only one current source for each of the M input bits.

The binary weighted M-bit DAC, however, has a strict accuracy requirement for its M current sources, and this gets exponentially (base 2) higher with a linear increase in M. If the accuracy is not met, the result may be a non-monotonic DAC operation, namely there may be instances where certain increases in value of the M-bit digital input result not in an increase in DAC output current but, instead, a decrease. A DAC having such behavior may, if part of feedback loop, cause the system enter a continuous oscillation, or "hunting," about a reference point, because of over-correcting or missing state values.

The strictness of the accuracy requirement will be illustrated by example. Assume a four-bit binary weighted DAC having an ideal LSB current source, generating one LSB unit of current for an LSB value of "1." Assume that the example has the following inaccuracies: an MSB current source that is ¾ of an LSB current too low, a second-to-MSB current source that is ½ of an LSB current too high, and a third-to-MSB current source that is ¼ of an LSB current too high. If the input is "0111" the resulting DAC output current will be ¾ of an LSB too high, i.e., a current value of decimal 7¾ M instead of decimal 7, due to the above-described inaccuracy of the MSB-1 and MSB-2 sources. If the input value increases by one LSB to change to "1000," though, the output changes not to decimal 8 units of current, but to decimal 7¼ because of the above-described example inaccuracy of ¾ LSB in the MSB current source. Therefore, in this example, an increase of one LSB in the binary input causes a decrease in the DAC output, from decimal 7¾ to decimal 7¼, instead of an increase in the DAC output current.

Another architecture of DAC, termed a "thermometer DAC," forms an M-bit DAC using a stack of $2^M-1$ equal value current sources, connected in parallel and connected through an ON-OFF switch to a current summing device. An M to $2^M-1$ line binary decoder converts an M-bit binary input into $2^M-1$ control lines, each connected one of the $2^M-1$ ON-OFF switches. As an illustrative example, a four-bit thermometer DAC has fifteen (15) current sources with ON-OFF switches (16 sources if an overflow is included). If the M-bit binary input is "0111," representing decimal "7," the binary decoder generates a corresponding seven of the control lines as ON, typically switching on only the bottom seven of the $2^M-1$ one-bit current sources. If the M-bit input is increased by one LSB to represent a decimal "8" the binary decoder generates one additional of the $2^M-1$ control lines as ON, adding one LSB of current to the output. Hence, the name "thermometer" DAC.

The thermometer DAC is particularly useful in a feedback arrangement because it is inherently monotonic. Stated differently, for all values throughout the range of the M-bit input, an increase (or decrease) of the input value by one least significant bit (LSB) connects (or removes) exactly one of the thermometer's current sources. Therefore, regardless of the relative accuracy of the particular current source added (or removed), there is an increase (or decrease) in the DAC output current.

A thermometer DAC, however, has a high parts count, essentially doubling for each increase of one bit. As an illustrative example, a 10-bit thermometer DAC requires decimal 1023 current source elements. Increasing the resolution to 14 bits requires four times the quantity of current source elements, namely decimal 4196. For each added bit the doubling continues such that, for a 16-bit thermometer DAC, approximately 64 thousand (64K) switched current sources are required. This parts count makes a thermometer DAC impractical for some applications.

There is a third known general type of DAC, though, termed a "segmented DAC," that obtains some, but not all of the monotonicity benefit of the thermometer DAC, while avoiding some, but not all of the monotonicity shortcomings of the binary weighted DAC.

A conventional M-bit segmented DAC consists of multiple DACs, typically two, each receiving a block of the M bits. One example of a conventional M-bit segmented DAC breaks the M bits into two segments—an H-bit upper segment and an L-bit lower segment. The H-bit upper segment then feeds a high level DAC (H-DAC) and the L-bit lower segment feeds a low level DAC (L-DAC), each generating a current corresponding to the sum of the binary weights, within the M-bit input, of all of the non-zero bits in the segment that it receives.

As readily seen, in accordance with its principle of operation, the full range of the L-DAC within a conventional segmented M-bit DAC spans, ideally, exactly one LSB of the H-DAC, such that the L bits establish $2^L$ binary levels in the span. Since the H-DAC provides $2^H$ incremental levels, and the L-DAC provides $2^L$ levels between each of the H-DAC levels, the total resolution is $2^H \times 2^L = 2^{H+L} = 2^M$.

The known benefit of the conventional segmented DAC is that, since each of the DACs has a smaller number of bits than M, each may be implemented as a thermometer DAC. This can be demonstrated by picking an example M of sixteen bits, and implementing it as a conventional two-segment DAC, using an eight bit H-DAC and an eight-bit L-DAC. Both the H-DAC and the L-DAC require $2^8-1=255$ current sources. A 255 level thermometer DAC is readily manufacturable and requires a relatively small die size. Therefore, since both the H-DAC and the L-DAC can be implemented as a thermometer DAC, each is inherently monotonic. Further, the total number of current sources is only 512. For purposes of comparison, if the sixteen-bit DAC were constructed as one thermometer DAC the number of current sources would be $2^{16}-1$, which is approximately 64 thousand or 64K. The conventional two segment implementation of a sixteen bit DAC therefore requires 510/64,000 or 0.7% of the number of devices as a sixteen bit thermometer DAC.

A long known issue of the conventional segmented DAC, though, arises from its fundamental principle, which is that it obtains its reduction in parts count by substantially the same principle that is exploited by the weighted binary DAC, except that instead of implementing each bit of the M bits as a weighted current source, the M bits are broken into blocks, and each block is implemented as a weighted current source. Therefore, for all DACs corresponding to any block above the least significant block, the change in its output current corresponding to a one LSB change in its input bits, must match the total full scale (all 1s) output of all DACs corresponding to bit blocks having smaller weight than that block—to within one LSB current.

For example, in a conventional two-segment. DAC, the change in current output from the H-DAC in response to a one LSB change in its input must match the full scale current of the L-DAC within one LSB of the L-DAC, for every bit combination input to the H-DAC. Therefore, if both the H-DAC and the L-DAC are eight (8) bits, and a one LSB current step from the L-DAC is labeled "q," each one bit change in the H-DAC input must change the H-DAC output by 256q, plus or minus q. If the change is 255q then, assuming the L-DAC is perfect, there will be no change in the DAC output in response to a one. If such matching is not maintained, the segmented DAC may exhibit a non-monotonicity at the bit value transition points where the L-DAC input rolls over, i.e., goes from all "1s" to all "0s," thereby incrementing (or decrementing) the LSB of the H-DAC by one bit. This is inherent to the segmented DAC architecture.

FIGS. 1-3 illustrate the above-described non-monotonicity of known segmented DACs, as it manifests in a simulated input-output characteristic of a conventional segmented sixteen (16) bit DAC, formed of an eight (8)-bit H-DAC (not shown in the figures) and an eight (8)-bit L-DAC (not shown in the figures). The FIG. 1-3 simulation spans several consecutive LSBs of the H-DAC. FIG. 1 shows a first case, where all four of the illustrated LSB increments of the H-DAC labeled 12A, 12B, 12C and 12D, are the same height, each matching the full range of the L-DAC, labeled L-RANGE, within an accuracy of one LSB of the L-DAC. FIG. 2 shows a second case, where the LSB increment 12B' of the H-DAC output resulting from its binary input going from hexadecimal "10," i.e., binary "1010," to hexadecimal "11," i.e., binary "1011," is smaller than the L-RANGE of the L-DAC by an amount more than one LSB of the L-DAC. FIG. 3 shows a third case, where the LSB increment 12B" of the H-DAC output, at the same location as the 12B' increment of FIG. 2, is larger than the L-RANGE of the L-DAC, by an amount more than one LSB of the L-DAC.

Referring now to FIG. 1, if the current represented by one LSB of the 16-bit input is "q," the LSB of the HDAC will be 256q, and the range of the whole segmented DAC will be 65536q. As shown, when the digital input is hexadecimal "1000" the H-DAC DAC output is analog "4096" of q units of current, while the L-DAC current is zero. When the input varies from hexadecimal "10FF," hereinafter "10FF H" to "1100 H," the input to the H-DAC increases by one H-DAC LSB to "11," while the input to the L-DAC rolls over to "00." Since the FIG. 1 H-DAC has LSBs matched to the L-DAC, the result is that the output of the H-DAC increases by 256q, while the current of the L-DAC decreases by 255q. This yields a net increase in the segmented DAC output of q, representing a one LSB increase in the 16-bit input. This is shown by the near abutting ends (spaced by one current unit q) of the L-DAC range at position 14 and at the position after input goes from "10FF H" to "1100 H."

However, for various reasons it is often substantially impossible, at least within typical constraints of a manufactured product, for the LSB of an H-DAC to exactly equal to the whole range of the L-DAC. Therefore, even if both of the sub-DACs (i.e., the H-DAC & L-DAC) are monotonic, which is provided by thermometer DACs, the DAC as a whole will not be monotonic over its entire range.

FIG. 2 illustrates a simulated input-output characteristic of the same standard segmented sixteen (16)-bit DAC shown as simulated in FIG. 1, showing an example of a second case type scenario, where span 12b' between consecutive LSBs "10 H" and "11 H" of the H-DAC, which should have analog values spaced 256q apart, are instead smaller, by more than q, than 256q, i.e., the full range of the L-DAC. As can be seen, since the current increase from the one H-DAC LSB going from "10 H" to "11 H" is substantially less than 256q, that one LSB of the H-DAC input is substantially less than the subtraction of 255q resulting from the roll-over of the L-DAC input all "00." As a result, the overall output of the H-DAC will decrease by the amount labeled SEGMENT ERROR, instead of increase, in response to the input going from "10FF H" to "1100 H". As is well known to persons of ordinary skill in the art, such non-monotonicity of a DAC within certain feedback loops such as, for example, a frequency-lock loop digital controlled oscillator (not shown in FIG. 2) may cause the system oscillate around these segment points, i.e., each one-LSB increase (or decrease) of the H-DAC.

FIG. 3 illustrates a simulated input-output characteristic of the same standard segmented sixteen (16)-bit DAC as simulated for FIGS. 1 and 2, showing an example of a third case type scenario, where the LSB 14' of the H-DAC representing the current increase from the H-DAC input going from "10 H" to "11 H" is substantially more than 256q, that one LSB of the H-DAC input is substantially more than the subtraction of 255q resulting from the roll-over of the L-DAC input all "00." As a result, the overall output of the H-DAC will increase not by q, but by a substantially larger by the amount labeled SEGMENT SKIP ERROR. This means the output range in the SEGMENT SKIP ERROR is lost and cannot be accessed. Therefore, DAC accuracy is lost and, further, states of the controlled system such as, for example, an output frequency of a FLL will be lost as well.

SUMMARY

A brief summary of various aspects of various example embodiments is presented, including an overlapping segmented DAC that provides, among other identifiable features and benefits, an M-bit DAC having a high resolution and a low parts count, further providing a dynamically moving monotonic range, and moving the monotonic range to straddle certain bit value transitions otherwise causative of certain non-monotonicity. Some simplifications and omissions may be made in this summary, as it is intended to highlight and introduce some aspects of the various exemplary embodiments, but not to limit the scope of the invention. Further detailed descriptions of exemplary embodiments, also sufficient to enable those of ordinary skill in the art to make and use the inventive concepts of the embodiments, will follow in later sections.

One embodiment provides a dynamic ranging monotonic M-bit DAC having an S-bit upper range HR-DAC, and an R-bit lower range LR-DAC with S+R being greater than M, and the LR-DAC configured to have a full scale output equaling at least two least significant bits (LSBs) current of the S-bit HR DAC.

According to one aspect of one embodiment, a moving segment decoder converts an M-bit input into an S-bit input for the HR-DAC, and an R-bit input for the LR-DAC, the conversion setting the respective inputs to the HR-DAC and the LR-DAC to add, in binary arithmetic, to the M-bit input value, but that sets the LR-DAC input to an operating point allowing the L-DAC input to range in value beyond a point that., in a conventional segmented DAC, would toggle the LSB of the HR-DAC.

Further to the one aspect, transition points, for moving the operating point to a different point within the R-bit lower range, are selected and maintained along the R-bit lower range, these transition points preferably always being between, and not aligned with, transition points of the LSB of the S-bit upper range input. According to one aspect, a moving segment decoder detects when the lower R bits of the M-bit input exceed the transition point, in response, adds or subtracts one or more LSBs from the S-bit upper range and subtracts or adds a corresponding value from the R-bit lower range, to obtain the same total value of the S bits and R bits, but at a new operating range within the R-bit lower range.

According to one aspect, the full range of the R-bit LR-DAC, and thus overlap of the S-bit range and R-bit range may span four LSBs of the S-bit HR-DAC.

One aspect according to one or more embodiments includes a multilevel sub-ranging arrangement, having a top level pair of an upper S-bit HR-DAC and lower MR-bit midrange M-DAC, with the lower MR-bit midrange DAC being implemented by an SB-bit upper low-level DAC and an RB-level lower low-level DAC.

Various aspects of one or more embodiments provide a dynamic ranging monotonic M-bit DAC that may be arranged in a system feedback loop that, among other features and benefits, cannot become stuck in an unstable or perpetual oscillation.

Various aspects of one or more embodiments provide an overlapping segment, dynamic ranging monotonic M-bit DAC that may be arranged in a system feedback loop that, among other features and benefits, automatically converges to an operating point about which the DAC is monotonic, regardless of the initial state of the system, and regardless of the value of the reference within its given domain of values.

Various aspects of one or more embodiments provide, among other features and benefits, a significantly reduced requirement for matching between the LR-DAC and the HR-DAC.

The above-summarized illustrative examples of advances and features of the various exemplary embodiments and aspects are not intended to be exhaustive or limiting of the possible advantages that may be realized. Other advantages of the various exemplary embodiments will be apparent from the various embodiments and aspects that are further described with illustrative detail, and persons of ordinary skill in the art will, upon reading this disclosure, readily identify further variations within the scope of the appended claims, as well as additional applications.

DETAILED DESCRIPTION

Figure 1:
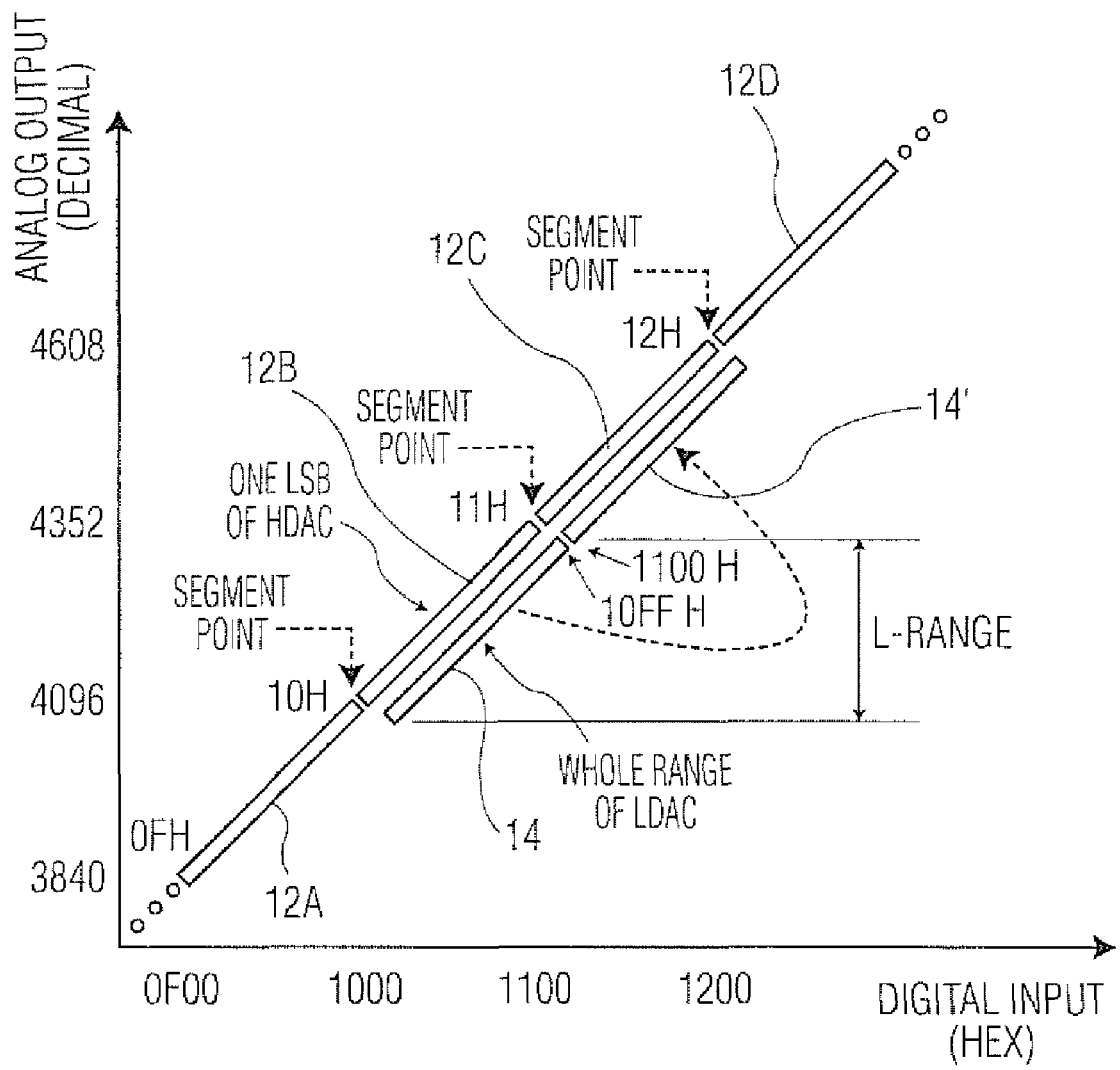
FIG. 1 illustrates a simulated input-output characteristic of a conventional segmented sixteen (16) bit DAC, formed of an eight (8)-bit H-DAC and an eight (8)-bit L-DAC, showing a span of several consecutive LSBs of the H-DAC where each of the LSBs matches the full range of the L-DAC within one LSB of the L-DAC.
Figure 2:
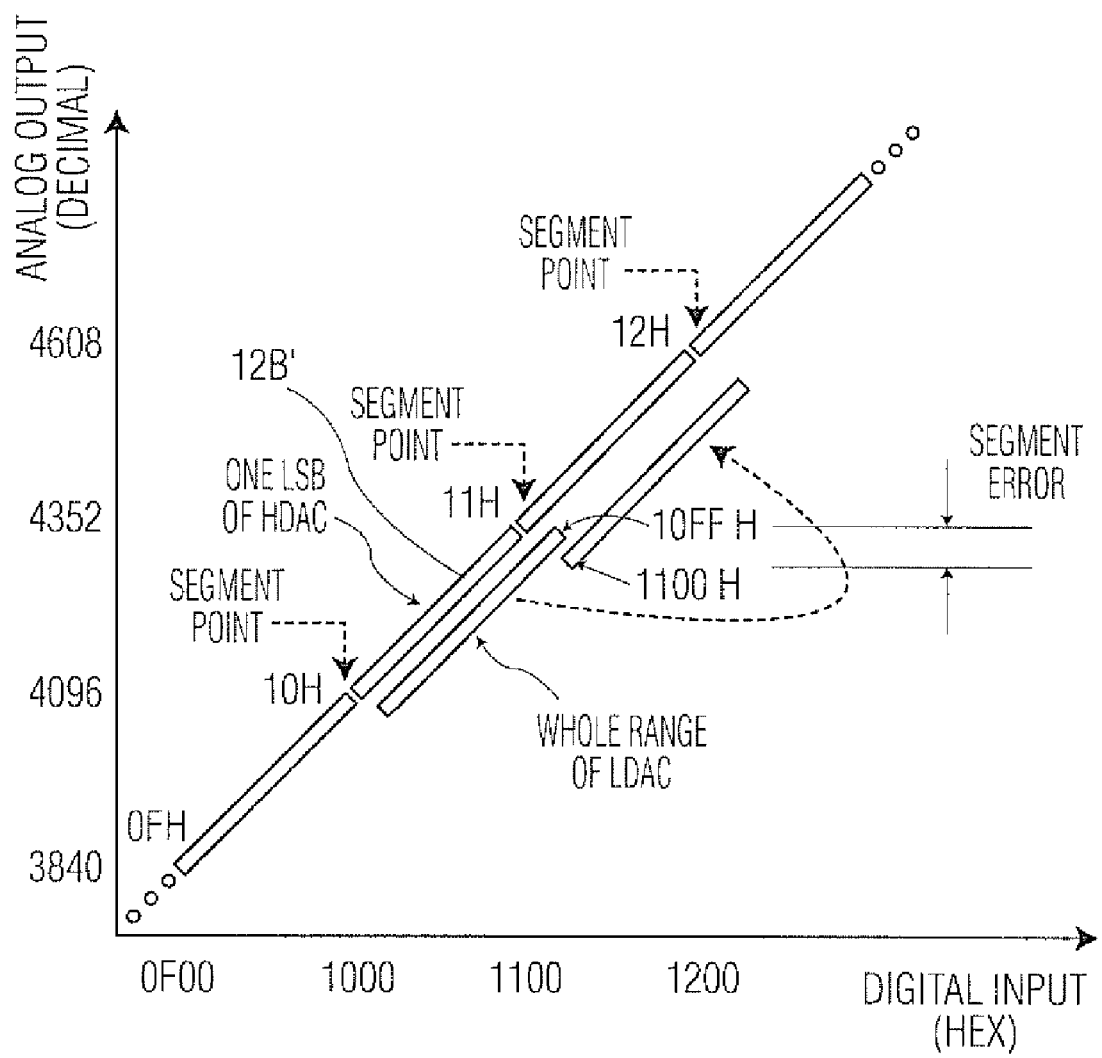
FIG. 2 illustrates a simulated input-output characteristic of a second scenario of the FIG. 1 example of a conventional segmented 16-bit DAC, over the same depicted span of H-DAC LSBs, but where one of the LSBs is more than one L-DAC LSB smaller than the full range of the L-DAC.
Figure 3:
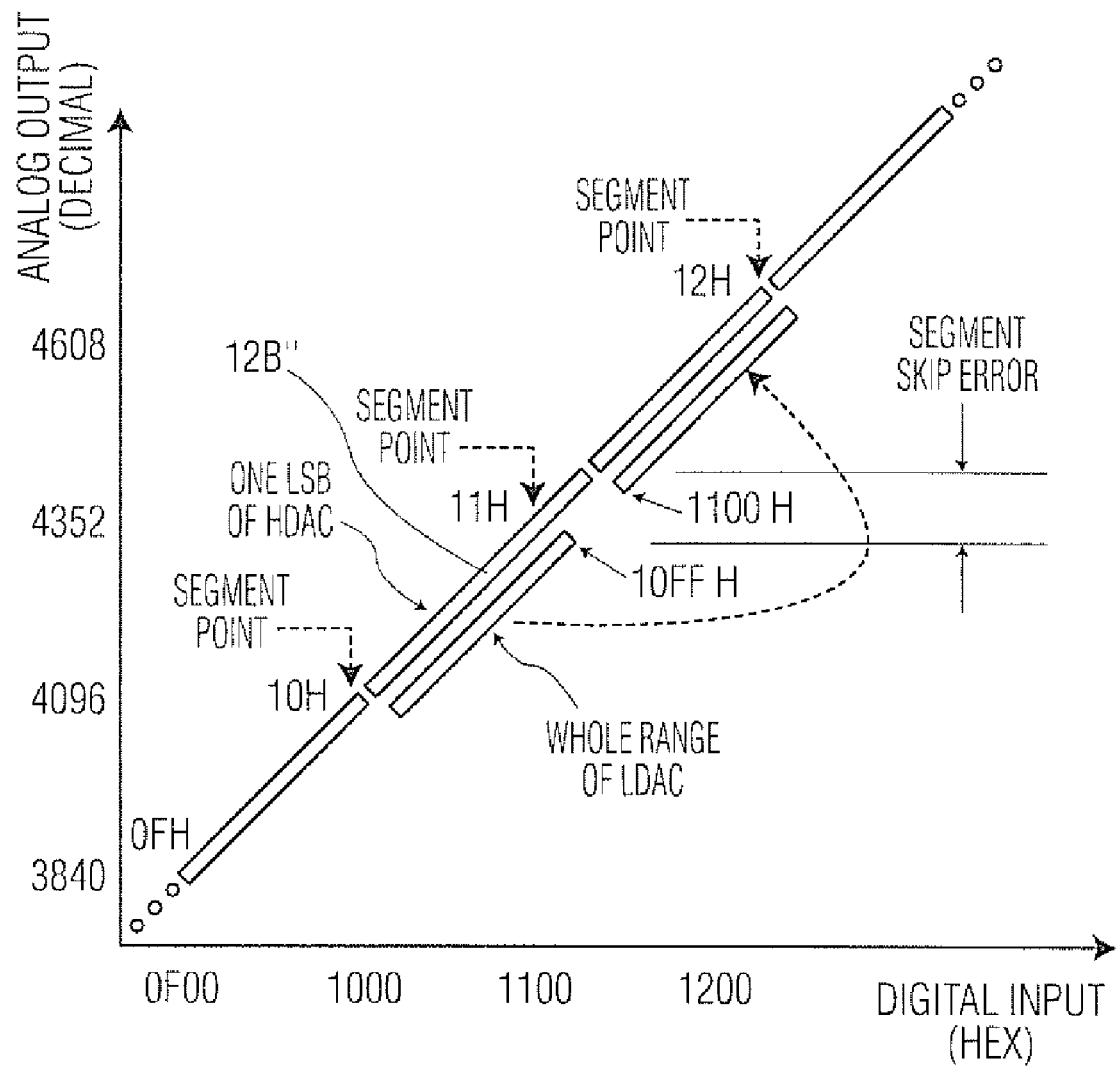
FIG. 3 illustrates a simulated input-output characteristic of a third scenario of the FIG. 1 example of a conventional segmented 16-bit DAC, over the same depicted span of H-DAC LSBs, but where one of the LSBs is more than one L-DAC LSB larger than the full range of the L-DACs.

Various examples according to exemplary embodiments are described in reference to specific illustrative example configurations and arrangements. The specific examples are only for illustrative purposes, selected to further assist a person of ordinary skill to form an understanding of the concepts sufficient for the person, applying the knowledge and skills such persons possess, to practice the embodiments. The scope of the embodiments and the range of implementations, however, are not limited to these specific illustrative examples.

The figures may not be drawn to scale, in that relative sizes and placements of items are not necessarily representative of the items' relative quantity of structure or relative importance of functions but, instead, may be arbitrary or may be chosen to provide a clear depiction of the figure's illustrated subject matter.

As will also be understood by persons of ordinary skill in the art upon reading this disclosure, various details of algorithms, protocols, and hardware technologies that are well known to such persons, and that such persons would select from and apply upon reading this disclosure to practice the embodiments are omitted, to avoid obscuring novel features and aspects. Similarly, at instances at which details are included, it will be readily understood by persons of ordinary skill in the art, from the context of the instance, that the details may not be complete and, instead, may only be described to the extent pertinent to particular features and aspects of an embodiment.

Example embodiments and aspects may be described separately, or as having certain differences. Separate description or description of differences, however, does not necessarily mean the respective embodiments or aspects are mutually exclusive. For example, a particular feature, function, or characteristic described in relation to one embodiment may be included in, or adapted for other embodiments.

According to one aspect of one general embodiment, a moving monotonic range decoder converts an M-bit input into an S-bit input for an S-bit high-range DAC, termed an HR-DAC, and an R-bit input for an R-bit low range DAC, termed an LR-DAC. The total of S bits and R bits is greater than M by a value Q, where Q is at least one. S and R are not necessarily equal. The LR-DAC "overlaps" the HR-DAC by Q bits. Related to the number of bits that overlap, the full scale range of the LR-DAC spans at least two LSBs of the HR-DAC. The number Q is the base 2 log of the number of HR-DAC LSBs spanned by the full range of the LR-DAC. Further number of LSBs of the HR-DAC spanned by the full scale of the LR-DAC may be a power of 2, i.e., 2, 4, 8 and so on.

As will be described in greater detail in later sections, the overlap provides, for any M-bit input, a non-unique solution for inputs to the HR-DAC and the LR-DAC that will result in the total of the HR-DAC current added to the LR-DAC current being equal to the current that correctly represents the M-bit input.

According to one general embodiment, the moving monotonic range decoder maintains transition points within the LR-DAC input range at which the decoder will increment (or decrement) the HR-DAC by one bit and sets the input to the HR-DAC and the LR-DAC, respectively, according to such transition points. This sharply contrasts with a conventional segmented DAC, which transitions, i.e., rolls over the L-DAC at the roll-over point of the L-DAC where its input goes from all 1s all 0s and, concurrently transitions the H-DAC by one LSB.

Further to the one aspect, transition points used in the calculating of an S-bit input to the HR-DAC and an R-bit input to the LR-DAC to move the operating point to a different point within the Whit lower range, are selected and maintained along the R-bit lower range, these transition points preferably always being between, and not aligned with, transition points of the LSB of the S-bit upper range input. According to one aspect, a moving segment decoder detects when the lower R bits of the M-bit input exceed, or meet another given relation with respect to a transition point and, in response, adds or subtracts one or more LSBs from the S-bit upper range and subtracts or adds a corresponding value from the R-bit lower range, to obtain the same total value of the S bits and R bits, but at a new operating range within the R-bit lower range. The operating range may provide for the M-bit input to range in value more than, for example, one LSB of the HR-DAC without toggling the LSB of the HR-DAC.

This calculating of the S-bit input to the HR-DAC and R-bit input to the LR-DAC to move the M-bit input state to an operating state within the S-bit and R-bit range of the upper DAC and partially overlapping lower DAC fundamentally differs from and contrasts with the conventional segmented M-bit. DAC; the conventional arrangement has an H-bit H-DAC and an L-bit L-DAC, receiving a respective upper H-bit segment and the remaining L-bit segment of an M-bit input, the L-DAC weighted such that the full scale of the L-bit segment spans exactly one LSB of the H-DAC, a one-bit transition up from all 1s has one allowable destination—all zeros—and that transition is necessarily co-incident with the toggling of the LSB of the HR-DAC.

Among the various benefits and features provided by examples according to this general embodiment, its novel overlapping segmented arrangement provides for an M-bit input to vary around a point that, in a conventional segmented DAC would, for example by a mere one LSB oscillation of the M-bit input, cause a toggling of the LSB of the HR-DAC input, without incurring such a toggling.

This, in turn provides, among other benefits and advantages, a DAC that in a feedback arrangement inherently converges to a stable operating point, without risk of feedback oscillation, regardless of the reference signal and regardless of the system's initial state with respect to the reference signal.

Figure 4:
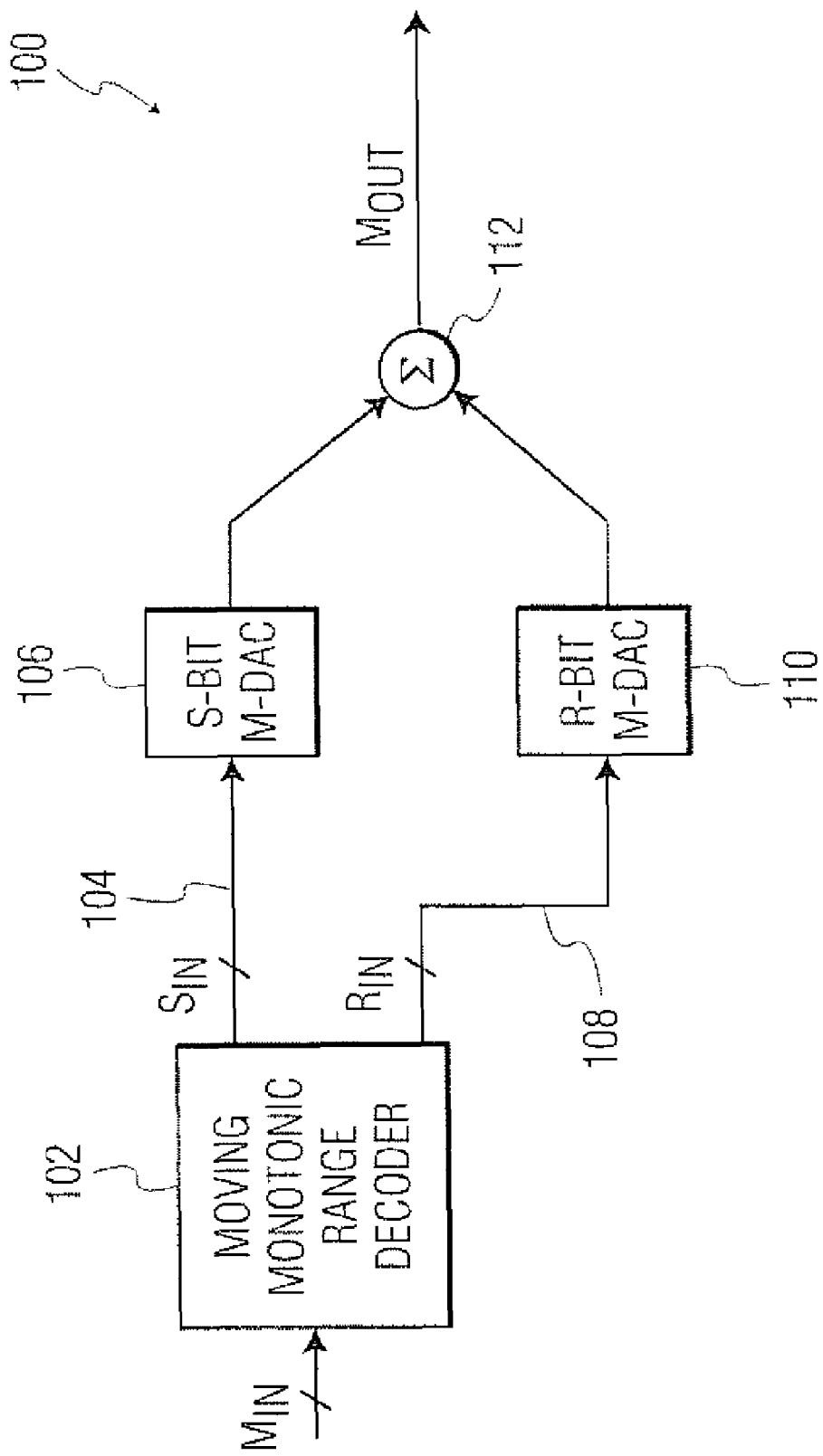
FIG. 4 is a functional block diagram representing an exemplary system having an exemplary 14-bit overlapped segment architecture ("OSA") DAC according to one embodiment, formed of an 8-bit H-DAC and a 7-bit L-DAC, with the full-scale current of the L-DAC equal to two LSBs of the H-DAC.

FIG. 4 shows a functional block diagram of an overlapping segment architecture (OSA) DAC 100 according to one exemplary embodiment Referring now to FIG. 4, the example 100 includes a moving monotonic range converter 102 that receives a given M-bit data, labeled $M_{IN}$. The converter 102 generates an S-bit high level DAC input 104, having a bit value $S_{IN}$, that feeds an S-bit high level DAC HR-DAC 106, and generates an R-bit low level DAC input 108, referenced as $R_{IN}$, that feeds an R-bit low level DAC, LR-DAC 110. The analog current output $S_{OUT}$ of the HR-DAC 106 and the analog current output $R_{OUT}$ of the R-bit LR-DAC 110 feed a current summing device 112. The output of the current summing device is the $M_{OUT}$ current conversion of the M-bit input value $M_{IN}$.

The internal architecture of the S-bit HR-DAC 104 and the internal architecture of the R-bit LR-DAC 110 may, but are not necessarily, the same. Each may, for example, be a conventional thermometer DAC, readily implemented by a person or ordinary skill in the art. For a given desired resolution of M-bits, the value of S and R, respectively, are a design choice, depending on the desired number of bits of overlap. This will be readily understood by a person of ordinary skill in the art upon reading this disclosure. Further, depending on the number of bits in S and R, at least one of the S-bit HR-DAC 104 and the R-bit. LR-DAC 110 may be implemented as a weighted binary DAC.

One illustrative example of an implementation of an OSA DAC such as depicted at FIG. 4 may use an 8-bit S-bit HR-DAC 104 and a 7-bit R-bit LR-DAC 110, with an overlap of one bit, meaning the full range of the LR-DAC equals two LSB steps of the HR-DAC 104, to yield a 14-bit DAC. Thus, HR-DAC 104 may be viewed as having seven unique bits and one shared bit and, likewise, the LR-DAC 110 may have six unique bits and one shared bit. Referencing the current generated by the FIG. 4 LR-DAC 110 from one LSB as one q, it can be seen that the resolution is 14 bits, instead of 15 bits, because the full range of the 8-bit. LR-DAC 110 is two LSB steps of the HR-DAC 104 and, therefore, the LR-DAC 110 contributes 128q additional quantizing steps to the HR-DAC, instead of 256.

Figure 5:
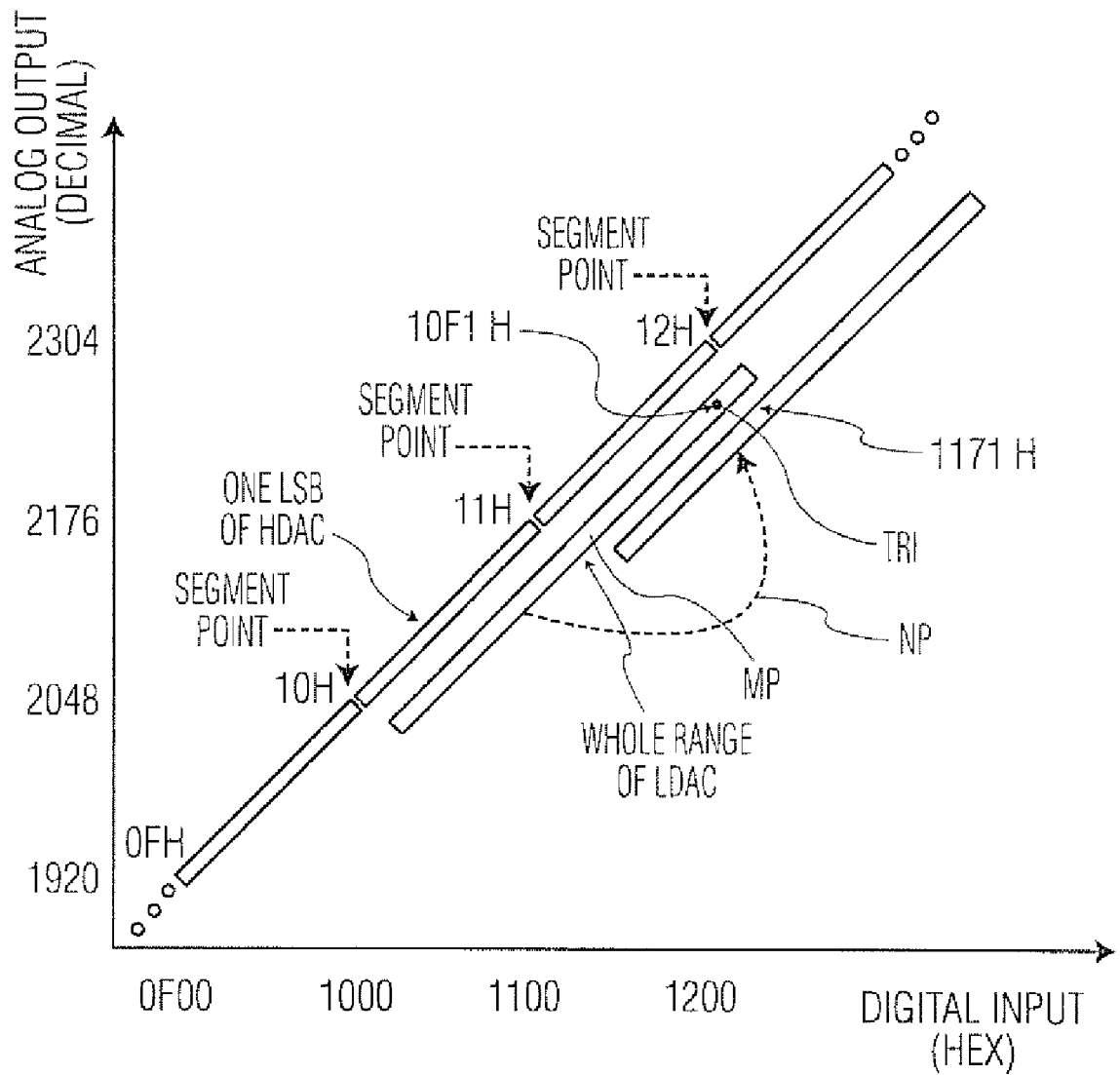
FIG. 5 shows a simulated digital input-current output characteristic of one example OSA DAC according to one embodiment, having an L-DAC full range of two ideal LSBs of the H-DAC, in a first case scenario, which is the consecutive H-DAC LSB producing an incremental current change equal to the full range current of the LDAC, to an accuracy within one LSB unit of current of the LDAC.

One example operation on an OSA DAC such as the example 100 depicted at FIG. 4 is illustrated, in part, at FIG. 5. The horizontal axis MX represents, in hexadecimal format, a 16-bit input $M_{IN}$ to the moving monotonic range converter 102, and the vertical axis AY represents the analog current output from the summing device 112. The example will illustrate the principle of operation of the moving monotonic range converter 102 in generating $S_{IN}$ and $R_{IN}$ to control transition points of the LR-DAC 110 and LSB toggling of the HR-DAC 104. It will be understood, though, that the operations illustrated at FIG. 5 assume an 8-bit LR-DAC, and an 8-bit HR-DAC, with an overlap of one bit, to form a 15-bit OSA DAC.

Referring to FIG. 5, it will be assumed that the moving monotonic range converter 102 toggled the SIN feeding the HR-DAC to hexadecimal 10 prior to the depicted snapshot. Next, assume repeated one LSB step increases in the $M_{IN}$ value, starting at hexadecimal 1000 and ending at hexadecimal 10FF. Now, assume one additional LSB increase in the $M_{IN}$ value. This rolls all of the lower eight bits of the $M_{IN}$ value from their state of all 1s to a state of all zeros, and toggles the LSB of the upper eight bit segment of $M_{IN}$. However, the moving monotonic range converter 102 does not roll over the $R_{IN}$ bits feeding the LR-DAC 110, and does not toggle LSB of the $S_{IN}$ bits feeding the HR-DAC 104. Instead the moving monotonic range converter 102, programmed or configured to incorporate the fact that the LR-DAC 110 spans two LSBs of the HR-DAC 104, not one LSB as in conventional segmented DACs, simply increments $R_{IN}$ from 0111 to 1000. Stated differently, since one LSB of the HR-DAC 104 is only 128 steps of the LR-DAC, at the $M_{IN}$ value of 10FF the LR-DAC 110 is only ½ of the way up the range, at the point labeled MP in FIG. 5.

Continuing with the above-described example operation of a 15-bit OSA DAC according to one or more exemplary embodiments, after $M_{IN}$ goes from hexadecimal 10FF to hexadecimal 1100, it will be assumed that $M_{IN}$ continues to increase step fashion until it reaches hexadecimal 1171. The $R_{IN}$ value with the range of $R_{IN}$ is now at the TR1 point shown at FIG. 5. It will be assumed that TR1 has been stored or otherwise incorporated as a transition point in the moving monotonic range converter 102, for it to use in toggling the LSB of the $S_{IN}$ bits feeding the HR-DAC 104. TR1 in this example is hexadecimal F1 within the range of the $R_{IN}$ values. The TR1 of hexadecimal F1 is only one example transition point. It will be easily understood by persons of ordinary skill in the art upon reading this disclosure that other transition points could be used.

Further continuing with the above-described example operation according to a 15-bit OSA DAC of one or more exemplary embodiments, after $M_{IN}$ goes from hexadecimal 10FF to hexadecimal 1100, the moving monotonic range converter 102, in response to detecting $R_{IN}$ reaching the TR1 transition point, adds one LSB to the $S_{IN}$. However, although the LR-DAC 110 of this example is an 8-bit DAC, due to the overlap of one bit with the HR-DAC 104, this increases the current output of the HR-DAC 104 not by 256q, but by only 128q. The moving monotonic range converter 102 can therefore subtract this from the $R_{IN}$ value to maintain a continuous linear DAC conversion characteristic. The moving monotonic range converter 102 performs this by simply subtracting binary "10000000" from the hexadecimal F1, which is binary "11110001," and obtains the new $R_{IN}$ of binary "01110001," or hexadecimal 71, as shown on FIG. 5.

The above-described transition operation performed by the moving monotonic range converter 102 is graphically represented on FIG. 5 as "NP".

The above example operation described in reference to FIG. 5 assumed all of the LSBs of the HR-DAC 104 were matched to ½ of the full range of the LR-DAC 110. This assumption therefore does not demonstrate the various features, benefits and advantages of the various embodiments.

More particularly, actual implementations of devices such as the HR-DAC 104, there may be inaccuracies such that one LSB increase may not be exactly half of the LR-DAC range. In other words, one LSB of the HR-DAC 104 may be other than 128q. Examples of such inaccuracy may include one LSB of the HR-DAC being 138q or 108q, instead of the 128q nominally matching the LR-DAC 110. As will be understood from this description, though, OSA DACs according to the exemplary embodiments, particularly when installed in a closed loop feedback system, converge to a monotonic operating range, so that stability and accuracy of the system will not be compromised. One particular example application showing and utilizing this feature is a digital frequency-lock loop (DFLL).

These mismatches could happen in two different ways. In a first case, one step of the HDAC may be smaller than the normal value. In a second case, one step of the HDAC may be larger than the normal value.

Figure 6:
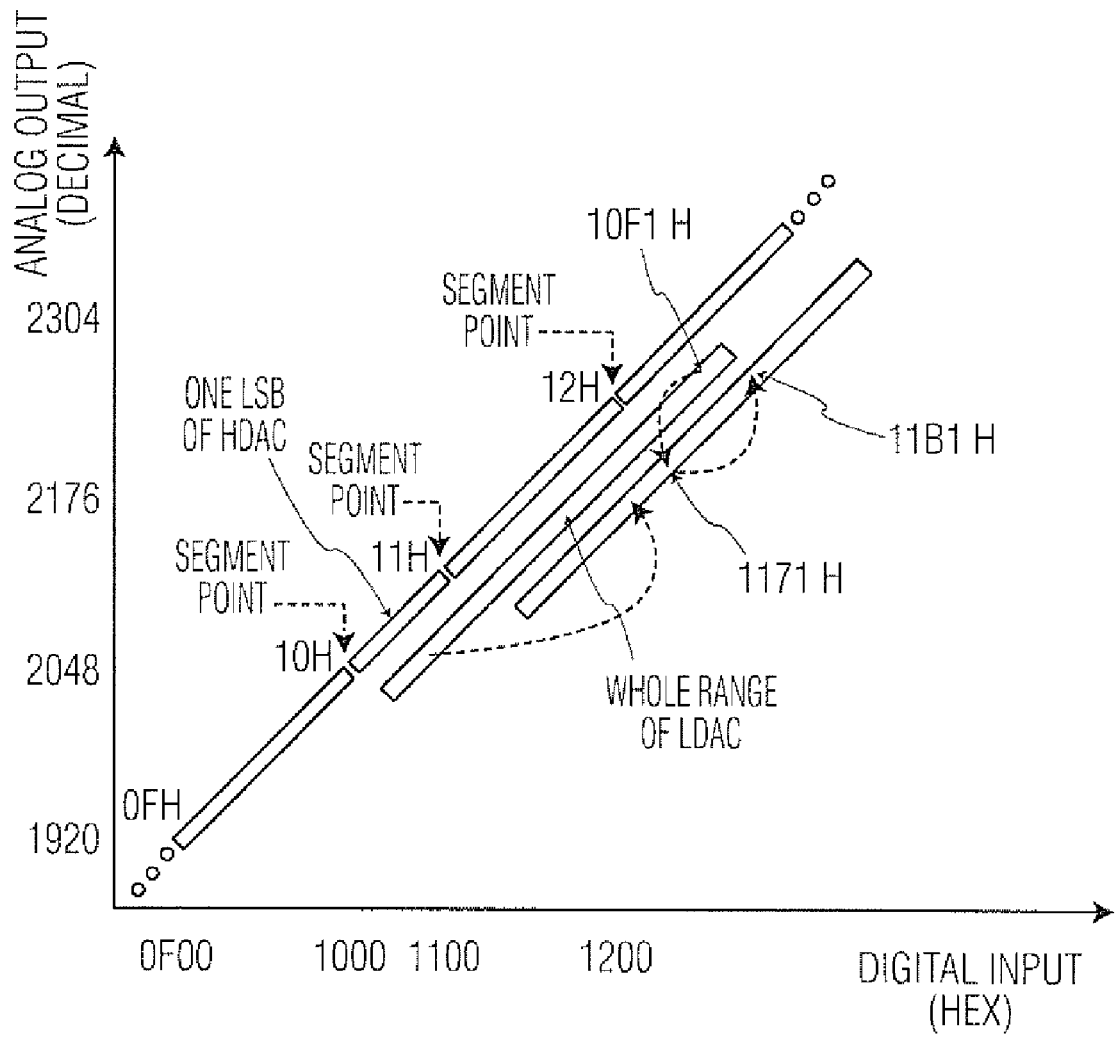
FIG. 6 shows a simulated digital input-current output characteristic of an OSA DAC having the L-DAC range of the FIG. 4 OSA L-DAC, the depicted portion showing consecutive LSBs of the H-DAC within a range exhibiting a second case scenario, which is two consecutive H-DAC LSBs producing an incremental current difference smaller than the full range current of the LDAC, by an amount more than one LSB unit of current of the LDAC.

FIG. 6 shows an extreme situation of the first case, where the step (10H to 11H) of HDAC may be roughly half of the normal value. This is a very large mismatch for HDAC. In this case, when the input 10F1 H was transferred to 1171 H, the analog output shows a large drop, which is about one quarter of the LDAC's range. Then, the feedback of the DFLL when the loop is closed, adjusts it to about 11B1 H which has a similar analog output as the original 10F1 H input.

Since the 11B1 H is also in the central part, the DFLL can lock safely around this point. Obviously, the original 10F1 H was not a safe point for DFLL to lock because it was too close to the end of the low 8-bit segment point.

Figure 8:
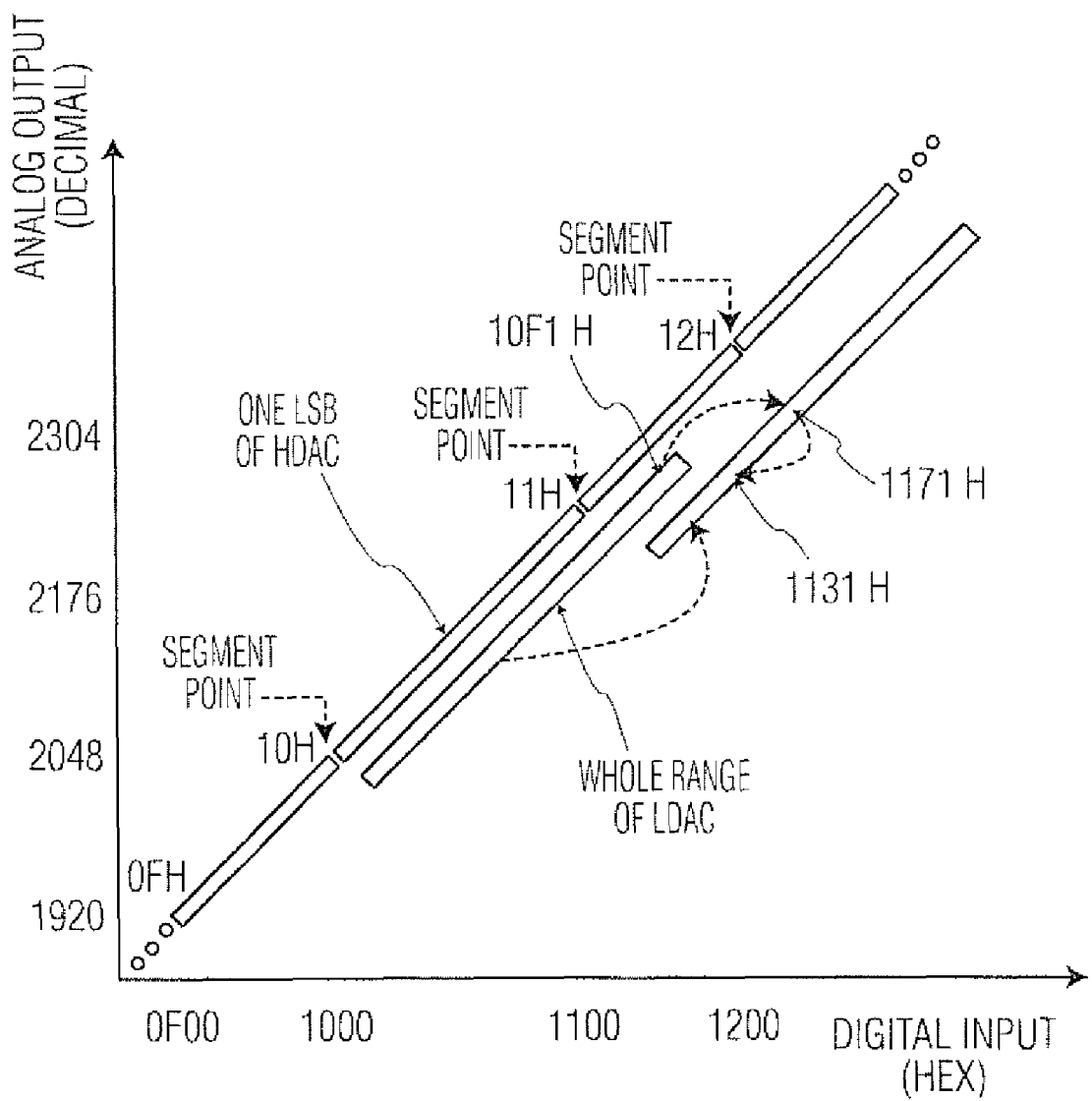
FIG. 8 illustrates one example portion of one simulated digital input-current output characteristic of one example OSA DAC, according to the FIG. 4 example of one exemplary embodiment, except having an L-DAC spanning four H-DAC LSBs.

FIG. 8 shows an example of the second case, where one step of the HDAC is larger than the normal value. Here, the adjustment is similar to the first case. As shown in FIG. 8, the step (10H to 11H) of HDAC may be roughly 1.5× of the normal value. Adjustment may be "10F1 H→1171 H→1131 H", ensuring that there won't be any missing analog output.

Since the whole range of the LDAC is equal to two LSBs of the HDAC, the total resolution of the whole DAC is just 15-bit (7+8). By sacrificing one bit, the matching requirement between the two sub-DACs is relaxed from one LSB to 64 LSB (¼ of the LDAC's range) at least.

Concepts described above may be further applied to embodiments described below.

Figure 7:
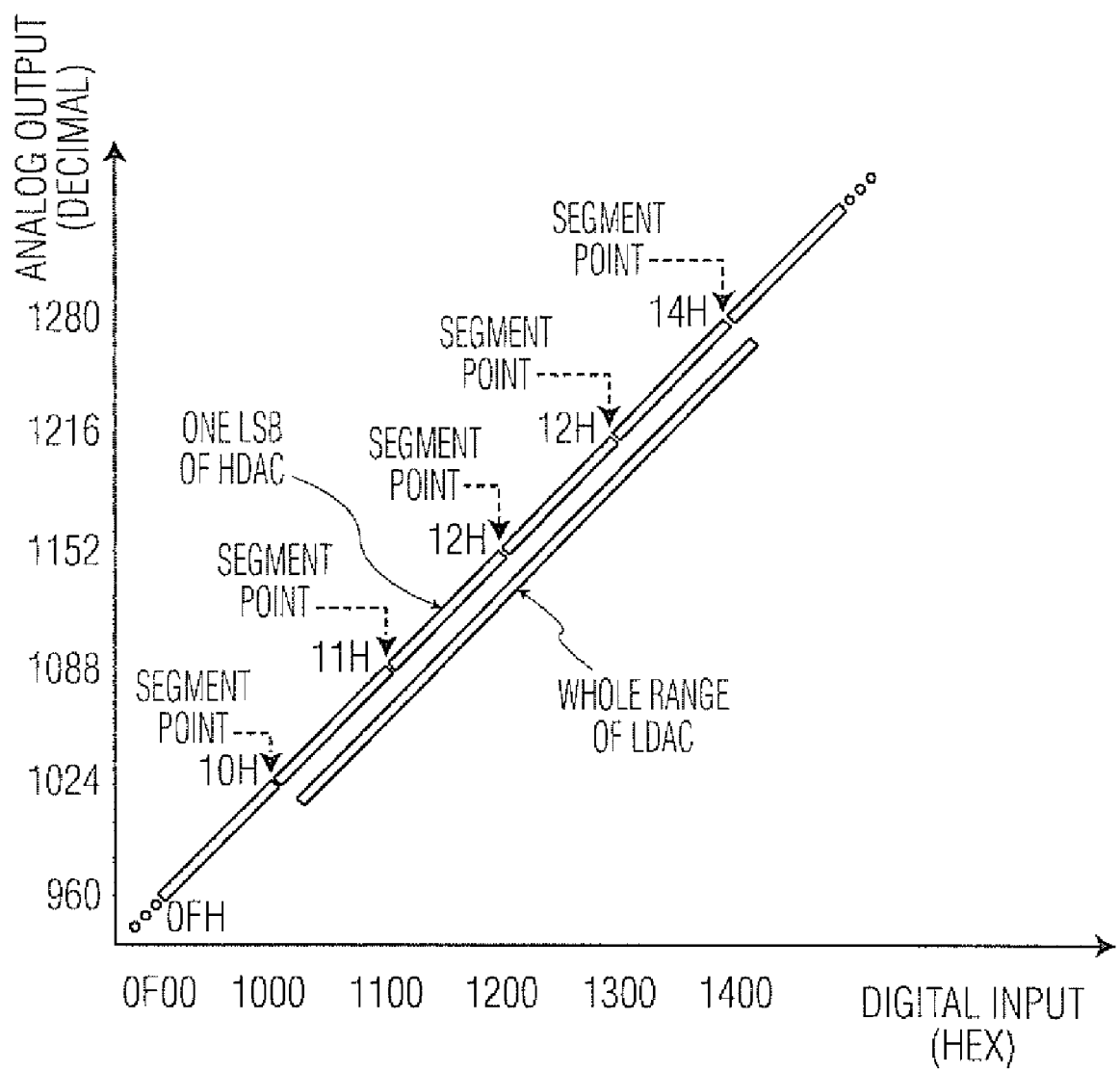
FIG. 7 depicts one portion of a simulated digital input-current output characteristic of an OSA DAC having the L-DAC range of the FIG. 4 OSA L-DAC, the depicted portion showing consecutive LSBs of the H-DAC within a range exhibiting a third case scenario, which is two consecutive H-DAC LSBs producing an incremental current difference larger than the full range current of the LDAC, by an amount more than one LSB unit of current of the LDAC.

FIG. 7 shows a case where two bits are sacrificed to get an even more relaxed matching requirement for the sub-DACs. Here, the whole range of the LDAC is equal to four LSBs of the HDAC. Assuming that one LSB is one q, then the whole range of the LDAC is 256q. One LSB of the HDAC is just 64q, so the whole segmented DAC's range is 16384q.

Another exemplary embodiment employs a multi-stage type multi-segmented DAC to obtain more bits of resolution. In basic form, one example according to an exemplary embodiment may implement a sub-DAC, such as the LR-DAC of the embodiments described above, as another overlapping segment architecture, or OSA, DAC according to one or more of the exemplary embodiments.

Figure 9:
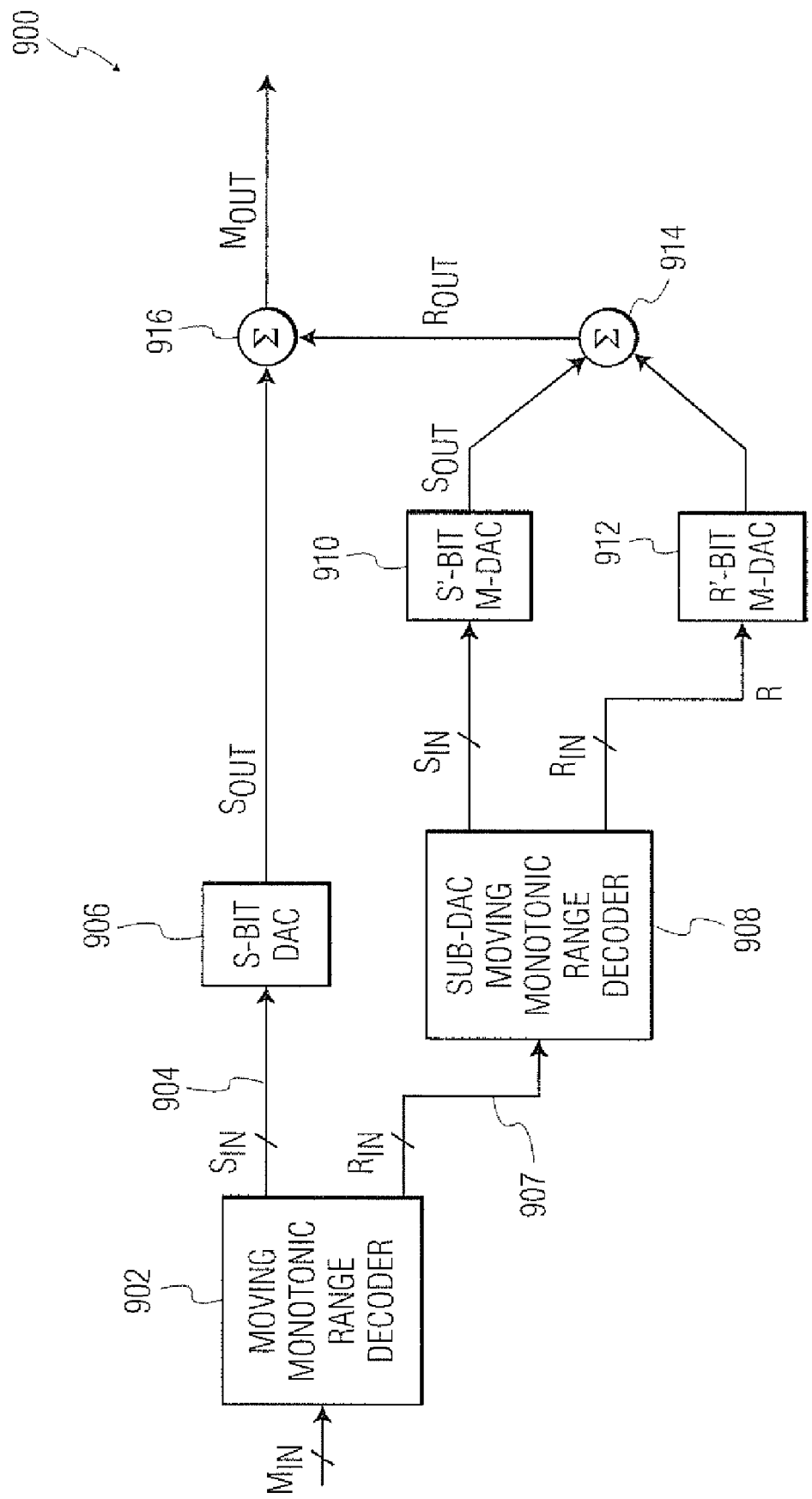
FIG. 9 shows one functional block representation of one example system implementing one two-level example of one multi-level sub-DAC aspect of an OSA DAC according to one or more exemplary embodiments.

FIG. 9 shows one functional block representation of one example system implementing one two-level example 900 of one multi-level sub-DAC aspect of an OSA DAC according to one or more exemplary embodiments.

Referring to FIG. 9, the example 900 may be described as a two-level binary tree architecture, each tree level having two branches, an upper branch and a lower branch, where each upper branch may be a conventional DAC and each lower branch may itself be an OSA DAC.

Continuing to reference FIG. 9, in the specific example 900, a moving monotonic range converter 902 receives an M-bit input and generates an S-bit data feeding an upper range S-bit HR-DAC 904 and an R-bit data 907 feeding a lower range R-bit decoder 908. The lower range decoder is a second-level control function, which may be identical in its principle of operation to the moving monotonic range converter 902 but generating an S' bit input to midlevel range S'-bit DAC MH-DAC 910 and a low-range R'-bit LR-DAC 912. The sub-DACs 910 and 912 feed s first current summing device 914. The first current summing device 914 and the output of the S-bit upper range DAC 906 feed a second current summing device 916, which outputs DAC output. As can be readily seen by a person of ordinary skill in the art, sample and hold devices (not shown) and other time alignment circuitry may be required.

Continuing to refer to FIG. 9, each of the three sub-DACs 904, 910 and 912 may be an 8-bit DAC. In one example implementation, a one-bit overlap may be used, such that the sub-DAC 910 may equal two LSBs of the HR-DAC 904. and the sub-DAC 912 may equal two LSBs of the sub-DAC 910. This may yield a 22 bit (7+7+8) resolution DAC. As will understood by a person of ordinary skill in the art, the additional levels may cause delays, but these can be readily characterized using conventional design methods and computer simulation tools known to such persons.

According to one embodiment, an M-bit OSA according to one or more of the exemplary embodiments may be used within a feedback loop such as, for purposes of illustration, a digital frequency-lock loop ("DFLL") arrangement. The M-bit OSA DAC according to one embodiment may receive an M-bit error sample that may be generated by, for example, by a conventional ADC, representing a difference between a reference system state and a detected system state. The OSA DAC, in response to the M-bit error sample, generates a system control current that, in turn, is input to the system.

Figure 10:
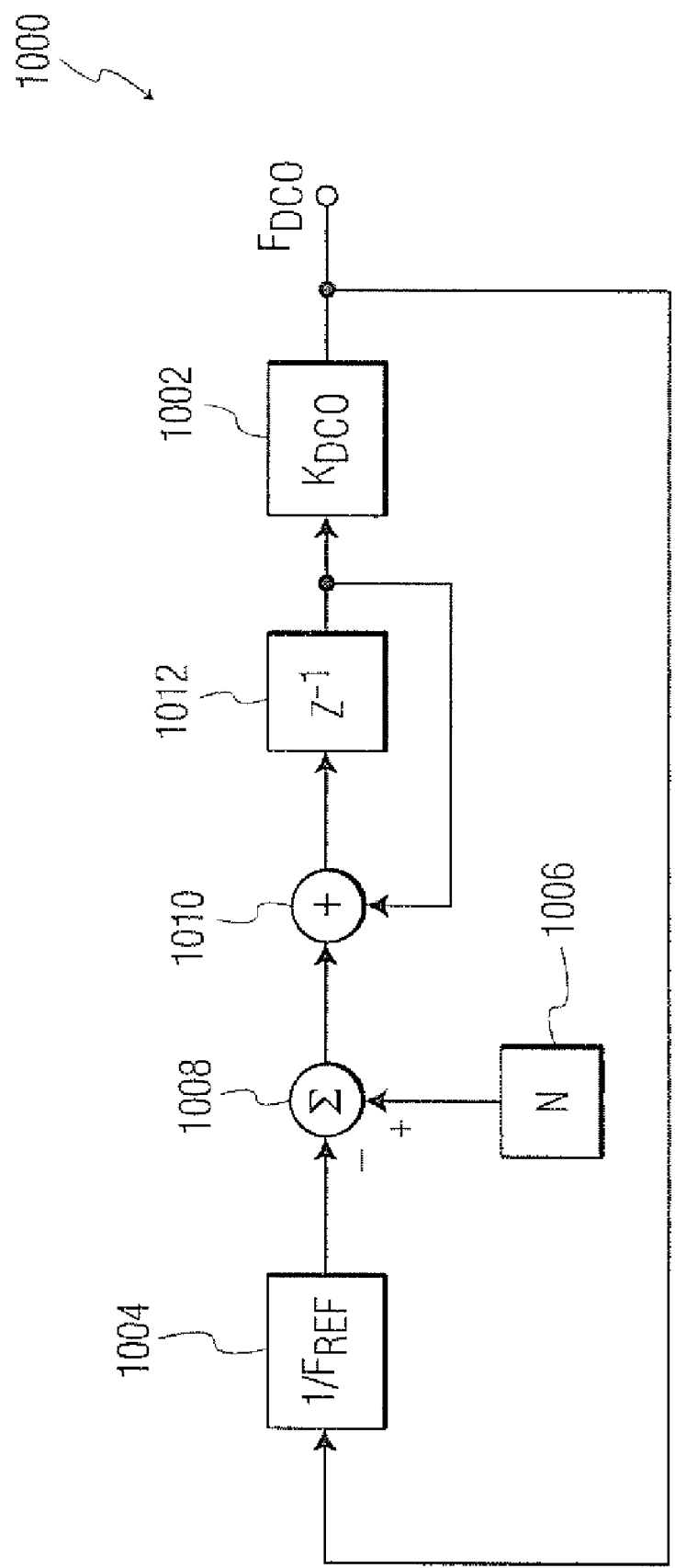
FIG. 10 is a functional block diagram showing one example digital frequency lock loop (DFLL) system according to one embodiment, having, in a particular example combination, an example OSA DACs according to one or more of the various exemplary embodiments.

FIG. 10 shows one example Digital Frequency Lock Loop (DFLL) 1000, formed of a digitally controlled oscillator (DCO) block 1002 having a digital control input 1002A and outputting at 1002B an analog oscillator signal of, for example, SOSC($\omega$t), $\omega$ being in radians per second and t in seconds, and a digital signal $F_{DCO}$ representing the frequency $\omega$. The DCO 1002 itself may be implemented according to conventional DCO architecture and hardware, i.e., having an M-bit DAC receiving a digital control input, converting this to an analog control signal (not shown in FIG. 10), that may be input to, for example, a voltage or current controlled reactive element (e.g. a varactor) of an oscillator (not shown in FIG. 10) to generate a signal having the frequency $\omega$ frequency, or being an integer multiple of $\omega$ that is divided down (for purposes of reducing cycle-to-cycle jitter), and having an M-bit ADC to generate $F_{DCO}$—but modified to replace the conventional DAC with an OSA DAC in accordance with FIG. 4. Illustrative example frequencies are an internal DCO oscillator frequency of 400 MHz, divided down by two to generate a DFLL output frequency of 200 MHz.

As will described in greater detail below, the previously described moving monotonic range provided by an OSA DAC according to these exemplary embodiments provides will provide, in a DFLL arrangement such as FIG. 10, a self-correcting feed-back by which the DFLL will lock to the reference frequency, even in instances where the LSB of the high range DAC (e. g., HR-HDAC 104 of FIG. 4) is so mismatched to the full scale of the low range DAC (e.g. LR-DAC 110) such that one iteration of the feedback loop may result in a non-monotonic change in the DAC output.

With continuing reference to FIG. 10, as previously described, the DCO 1002 may be a conventional DCO modified to have an OSA DAC in accordance with FIG. 4, having an 8-bit S-bit HR-DAC 104 and a 7-bit R-bit LR-DAC 110, with an overlap of one bit and, therefore, a DAC resolution M of fourteen (14) bits. The digital FDCO signal is fed back to a 1/FREF divider 1004 which may, for example, be a counter (not shown), which is subtracted from a divide-by integer N by the adder 1008 to generate a difference that inputs to one port (not separately numbered) of an adder 1010. The output (not separately numbered) of the adder 1010 is input to a delay 1012, and the delayed output (not separately numbered) is input to the control input 1002A of the DCO 1002, and is fed back to the adder 1010 to be summed with the difference generated by the substractor 1008.

One example operation of a DFLL according to the example DFLL 1000 depicted at FIG. 10 may described in reference to FIGS. 6 and 7.

Referring first to FIG. 6, this shows an extreme situation where the step of the HR-HDAC 104 between hexadecimal "10" to hexadecimal "11" is just half of the normal value.

Such a large mismatch may occur between conventional S-bit and R-bit DACs contemplated as implementations of the HR-DAC 104 and LR-DAC 110 of OSA DACs according to the exemplary embodiments. As shown in FIG. 6, at this transition the moving monotonic range decoder 102 moves hexadecimal "10F1" to hexadecimal "1171." The analog output shows therefore exhibits a large drop which is about one quarter of the full scale of LR-DAC 110.

Referring now to the DFLL example 1000 of FIG. 10, in this occurrence illustrated at FIG. 6, when the loop 1000 is closed, this will adjust the output to about hexadecimal "11B1," which is close to the original hexadecimal "10F1." Since the hexadecimal value "B1" of the hexadecimal "11B1," which is the input to the LR-DAC 110, is in the central part of that DAC 110, the DFLL of FIG. 10 can lock safely around this point. The moving monotonic range converter 102 within the OSA DAC of the DCO 1002 detected, on the other hand, that the original operating point of hexadecimal "10F1" was not a safe point for the DFLL to lock because it was to close to the end of the 8-bit segment. A conventional DFLL, because of its having a conventional segmented DAC, would not have this feature and, therefore, if a mismatch such as illustrated at FIG. 6 were to occur, would have a likelihood of a perpetual oscillation at the mismatch point.

The above example application was in reference to a DFLL system. There is no limitation on the scope of the "system," however, in which OSA DACs according to the various exemplary embodiments may be used. As an illustrative example, the "system" may be a servo-motor. Alternatively, the "system" may be an ADC, and the "error" may be used to calibrate that ADC, as will be understood by a person of ordinary skill in the art of ADCs and DACs upon reading this entire disclosure.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention.

Accordingly, the foregoing disclosure, description, and figures are for illustrative purposes only and do not in any way limit the invention, which is defined only by the claims.

We hereby claim:

1. An overlapping segmented M-bit digital to analog converter (DAC) for receiving an M-bit binary input $M_{IN}$ and generating a corresponding DAC current, comprising:
   a controller to receive $M_{IN}$ and generate in response, an S-bit upper range segment binary input $S_{IN}$ and an R-bit lower range segment binary input $R_{IN}$, where R+S is greater than M, with the most significant bit of $S_{IN}$ having a binary weight of $2^{M-1}$, and the binary weight of $2^R$ being at least twice the binary weight of the least significant bit (LSB) of $S_{IN}$
   an S-bit high range DAC configured to receive $S_{IN}$ and generate, in response, a high range DAC current proportional, by a constant K, to the summed binary weight of the $S_{IN}$ bits;
   an R-bit low range DAC configured to receive $R_{IN}$ and generate, in response, a low range DAC current proportional, by the constant K, to the summed binary weight of the $R_{IN}$ bits, and
   a current summer to add the high-range DAC current and the low range DAC current to generate said current.

2. The overlapping segmented M-bit digital to analog converter (DAC) of claim 1, wherein said controller is configured to detect transition points within the values of $M_{IN}$ and, in response, to add to $S_{IN}$ a transition quantity equal to at least the weight of the LSB position of $S_{IN}$, and subtract said transition quantity from $R_{IN}$.

3. The overlapping segmented M-bit digital to analog converter (DAC) of claim 2, wherein said controller is configured to detect transition points within the values of $M_{IN}$ and to add said transition quantity to $S_{IN}$ and subtract said transition quantity from $R_{IN}$ such that $R_{IN}$ remains within a given operating range.

4. The overlapping segmented M-bit digital to analog converter (DAC) of claim 1, wherein said R-bit low range DAC generates a full scale low range current FL in response to a full scale R-bit input of all 1s, and wherein the current output of said S-bit high range DAC changes, in response to a change in $S_{IN}$ of two $S_{IN}$ LSBs, an amount equal to one half of FL.

5. An overlapping segmented M-bit digital to analog converter (DAC) comprising:
   a decoder to receive a given M-bit data and to generate an S-bit upper segment data and an R-bit lower segment data;
   an S-bit sub-DAC to convert the S-bit upper segment data into an S-current proportional to the binary value of the S-bit upper segment data;
   an R-bit sub-DAC to convert the R-bit lower segment data into an R-current proportional to the binary value of the R-bit lower segment data; and
   a current summer to receive and generate an output DAC current based on a sum of the R-current and the S-current,
   wherein S+R is greater than M,
   wherein the coder maintains the value of the R-bit lower segment binary signal within a given range not including an all 1s condition, and
   wherein it generates the S-bit upper segment binary signal and the R-bit lower segment binary signal so that the sum of the S-bit upper segment binary signal and the R-bit lower segment binary signal is equal to the given M-bit binary signal.

6. A digital frequency lock loop, comprising:
   a digitally controlled oscillator (DCO) configured to receive an M-bit digital control input and to generate, in response, an output signal having a frequency FDCO;
   a feedback sensor configured to sample the output signal and to generate a feedback data indicative of the FDCO value; and
   a feedback controller configured to receive a reference frequency data FREF, compare FREF to FDCO, generate an error data representing a difference between FREF and FDCO, and to generate the M-bit digital control input based on the error data,
   wherein the DCO includes an overlapping segment M-bit digital-to-analog converter (DAC) to receive the M-bit digital control data and to generate, in response an analog control data, and includes an analog oscillator configured to generate an analog signal having a frequency ω based on the analog control signal, and the overlapping segment M-bit DAC comprises:
   a decoder to receive the M-bit data and to generate an S-bit upper segment data and an R-bit lower segment data;
   an S-bit sub-DAC to convert the S-bit upper segment data into an S-current proportional to the binary value of the S-bit upper segment data;

an R-bit sub-DAC to convert the R-bit lower segment data into an R-current proportional to the binary value of the R-bit lower segment data; and a current summer to receive and generate an output DAC current based on a sum of the R-current and the S-current, wherein S+R is greater than M, wherein the coder maintains the value of the R-bit lower segment binary signal within a given range not including an all 1s condition, and wherein the coder generates the R-bit lower segment binary signal and the S-bit upper segment binary signal so that the sum of the S-bit upper segment binary signal and the L-bit lower segment binary signal is equal to the given M-bit binary signal.

7. A method for controlling a frequency lock loop receiving a reference frequency data $F_{REF}$ to generate an output signal Sout to have a frequency $F_{DCO}$ locked to the reference frequency, comprising:

sampling Sout to generate a feedback data indicative of $F_{DCO}$;

generating an error data based on said feedback data and said $F_{REF}$ indicating a difference between $F_{DCO}$ and $F_{REF}$;

generating an M-bit digitally controlled oscillator (DCO) control data signal based on said error data;

converting said M-bit DCO control data to an analog DCO control signal;

generating an analog oscillating signal giving a frequency based, at least in part, on said analog DCO control signal; and generating Sout based on said analog oscillating signal, wherein converting said M-bit DCO control data to an analog DCO control signal comprises:

generating an operating point data having an S-bit upper range operating point and an R-bit lower range operating point, where S+R is greater than M, converting the S-bit upper range operating point to an upper range operating current converting the R-bit lower range operating point to a lower range operating current, and generating the analog DCO control signal based on a sum of the upper range operating current and the lower range operating current, wherein the lower range operating current corresponding to a full-scale value of the R-bit lower range operating point is at least twice the upper range operating current corresponding to an S-bit upper range operating point of one least significant bit (LSB), and wherein said generating an operating point data generates the S-bit upper range operating point and the R-bit lower range operating point to maintain the R-bit operating point within a given operating range within the full span of R-bit values.

* * * * *